(12) United States Patent
Ohuchida et al.

(10) Patent No.: US 12,400,835 B2
(45) Date of Patent: Aug. 26, 2025

(54) PLASMA PROCESSING METHOD AND PLASMA PROCESSING SYSTEM

(71) Applicant: Tokyo Electron Limited, Tokyo (JP)

(72) Inventors: Satoshi Ohuchida, Miyagi (JP); Koki Mukaiyama, Miyagi (JP); Noboru Saito, Miyagi (JP); Yoshihide Kihara, Miyagi (JP); Maju Tomura, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 274 days.

(21) Appl. No.: 17/978,558

(22) Filed: Nov. 1, 2022

(65) Prior Publication Data
US 2023/0135998 A1 May 4, 2023

(30) Foreign Application Priority Data
Nov. 1, 2021 (JP) ................ 2021-178604

(51) Int. Cl.
H01J 37/32 (2006.01)
H01L 21/311 (2006.01)

(52) U.S. Cl.
CPC .. *H01J 37/32449* (2013.01); *H01J 37/32724* (2013.01); *H01L 21/31116* (2013.01); *H01L 21/31144* (2013.01); *H01J 37/32146* (2013.01); *H01J 2237/2001* (2013.01); *H01J 2237/334* (2013.01)

(58) Field of Classification Search
None
See application file for complete search history.

(56) References Cited

FOREIGN PATENT DOCUMENTS

| JP | 2016-039310 A | 3/2016 |
| JP | 2017-050529 A | 3/2017 |
| JP | 2021-077865 A | 5/2021 |
| JP | 2021-090039 A | 6/2021 |
| WO | WO2019/178030 | * 3/2019 |

* cited by examiner

Primary Examiner — Stephanie P Duclair
(74) Attorney, Agent, or Firm — PROCOPIO, CORY, HARGREAVES & SAVITCH LLP

(57) ABSTRACT

A plasma processing method performed in a plasma processing apparatus having a chamber is provided. This method comprises: (a) providing a substrate having a film stack including a silicon oxide film and a silicon nitride film onto a substrate support in the chamber; and (b) forming a plasma from a processing gas containing HF gas and at least one of $C_xF_y$ gas (where x and y are integers equal to or greater than 1) and phosphorus-containing gas to etch the film stack, wherein, in (b), the substrate support is controlled to a temperature of 0° C. or more and 70° C. or less, and a bias RF signal of 10 kW or more or a bias DC signal of 4 kV or more is supplied to the substrate support.

19 Claims, 8 Drawing Sheets

PLASMA PROCESSING METHOD AND PLASMA PROCESSING SYSTEM

CROSS-REFERENCE TO RELATED APPLICATIONS

The present application claims priority under 35 U.S.C. § 119 to Japanese Patent Application No. 2021-178604 filed on Nov. 1, 2021, the entire contents of which are incorporated herein by reference.

BACKGROUND

1. Field

Exemplary embodiments of the present disclosure relate to a plasma processing method and a plasma processing system.

2. Related Art

JP 2016-039310 A discloses a method for etching multilayer films having dielectric constants that are different from each other.

SUMMARY

A plasma processing method performed in a plasma processing apparatus having a chamber is provided in an exemplary embodiment of the present disclosure. This method comprises: (a) providing a substrate having a film stack including a silicon oxide film and a silicon nitride film onto a substrate support in the chamber; and (b) forming a plasma from a processing gas containing HF gas and at least one of $C_xF_y$ gas (where x and y are integers equal to or greater than 1) and phosphorus-containing gas to etch the film stack, wherein, in (b), the substrate support is controlled to a temperature of 0° C. or more and 70° C. or less, and a bias RF signal of 10 kW or more or a bias DC signal of 4 kV or more is supplied to the substrate support.

DETAILED DESCRIPTION

Figure 1:
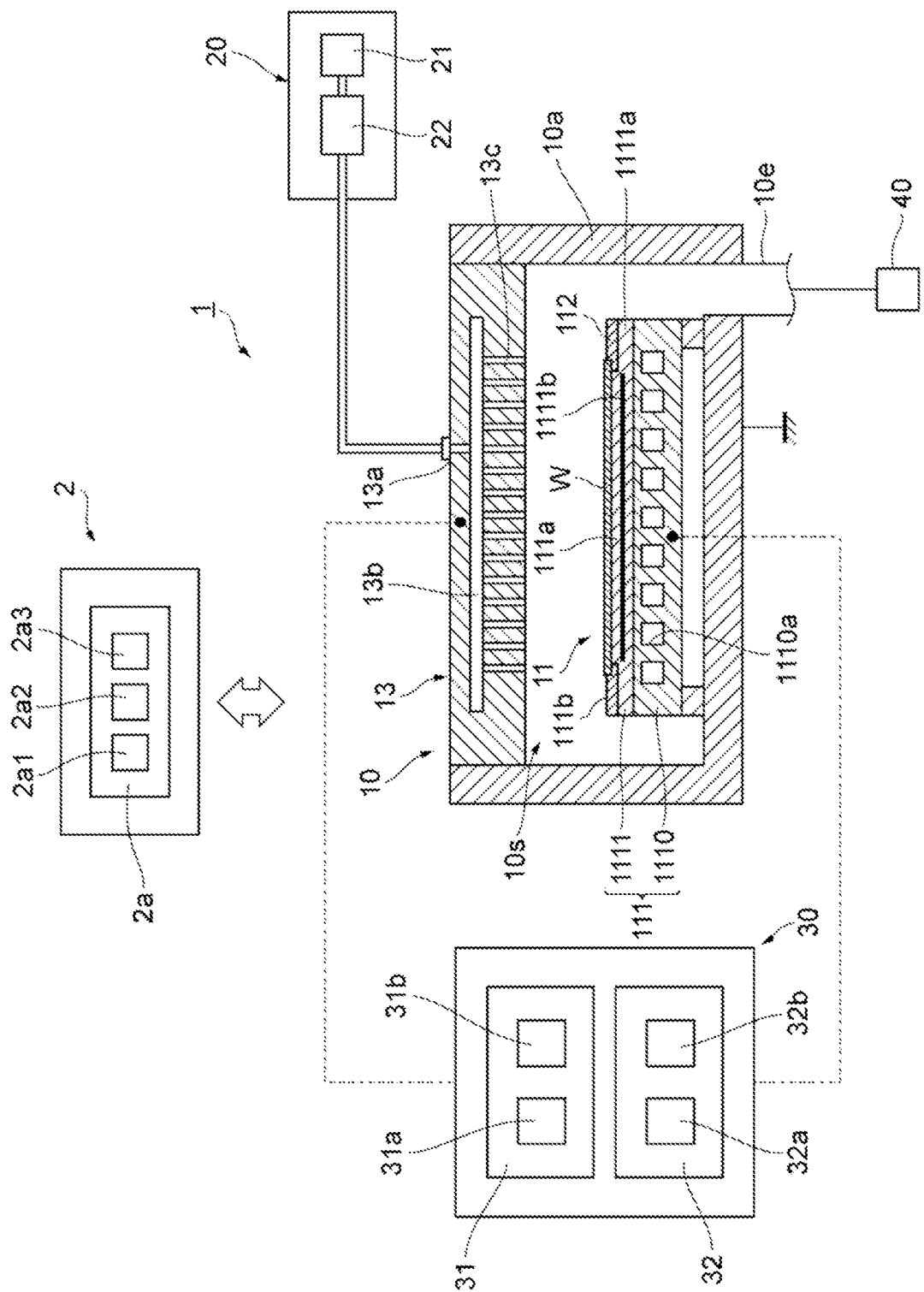
FIG. 1 is a figure schematically illustrating an exemplary plasma processing system.

Embodiments of the present disclosure will now be described.

One exemplary embodiment is a plasma processing method performed in a plasma processing apparatus having a chamber, the method comprising: (a) providing a substrate having film stack including a silicon oxide film and a silicon nitride film onto a substrate support in the chamber; and (b) forming a plasma from a processing gas containing HF gas and at least one of $C_xF_y$ gas (where x and y are integers equal to or greater than 1) and phosphorus-containing gas to etch the film stack, wherein, in (b), the substrate support is controlled to a temperature of 0° C. or more and 70° C. or less, and a bias RF signal of 10 kW or more or a bias DC signal of 4 kV or more is supplied to the substrate support.

In one exemplary embodiment, the substrate has a carbon-containing film defining at least one opening on the film stack.

In one exemplary embodiment, the carbon-containing film is a photoresist film, a spin-on carbon film, or an amorphous carbon film.

In one exemplary embodiment, the $C_xF_y$ gas includes at least one gas selected from the group consisting of $C_3F_6$ gas, $C_4F_8$ gas, $C_4F_6$ gas, and $C_3F_8$ gas.

In one exemplary embodiment, the phosphorus-containing gas is a phosphorus halide gas.

In one exemplary embodiment, the phosphorus halide gas is phosphorus fluoride.

In one exemplary embodiment, the phosphorus-containing gas is at least one gas selected from the group consisting of $PF_3$ gas, $PF_5$ gas, $POF_3$ gas, $HPF_6$ gas, $PCl_3$ gas, $PCl_5$ gas, $POCl_3$ gas, $PBr_3$ gas, $PBr_5$ gas, $POBr_3$ gas, $PI_3$ gas, $P_4O_{10}$ gas, $P_4O_8$ gas, $P_4O_6$ gas, $PH_3$ gas, $Ca_3P_2$ gas, $H_3PO_4$ gas, and $Na_3PO_4$ gas.

In one exemplary embodiment, the processing gas further includes an oxygen-containing gas.

In one exemplary embodiment, the oxygen-containing gas is at least one gas selected from the group consisting of $O_2$, CO, $CO_2$, $H_2O$, and $H_2O_2$.

In one exemplary embodiment, the processing gas further includes a $C_uH_vF_w$ gas (where u and v are integers equal to or greater than 1, and w is an integer equal to or greater than 0).

In one exemplary embodiment, the $C_uH_vF_w$ gas is at least one gas selected from the group consisting of $CH_2F_2$ gas, $CHF_3$ gas, $CH_3F$ gas, $C_4H_2F_6$ gas, $C_3H_2F_4$ gas, and $CH_4$ gas.

In one exemplary embodiment, the bias DC signal is a voltage pulse comprising two alternating periods with different voltage levels.

In one exemplary embodiment, (b) includes: (b1) forming a plasma from a processing gas containing HF gas and at least one of $C_xF_y$ gas and phosphorus-containing gas at a first flow rate ratio to etch the film stack; and (b2) forming a plasma from a processing gas containing at least one of HF gas and $C_xF_y$ gas and phosphorus-containing gas at a second flow rate ratio different from the first flow rate ratio to etch the film stack.

In one exemplary embodiment, (b1) and (b2) are alternately repeated in (b).

In one exemplary embodiment, (b) further includes: (b3) forming a plasma from a processing gas containing HF gas and at least one of $C_xF_y$ gas and phosphorus-containing gas at a third flow rate ratio different from the first flow rate ratio and the second flow rate ratio to etch the film stack.

In one exemplary embodiment, (b) includes: (b4) forming a plasma from a processing gas containing HF gas, at least one of $C_xF_y$ gas and phosphorus-containing gas, and $C_uH_vF_w$ gas at a fourth flow rate ratio to etch the film stack; and (b5) forming a plasma from a processing gas containing HF gas, at least one of $C_xF_y$ gas and phosphorus-containing gas, and $C_uH_vF_w$ gas at a fifth flow rate ratio different from the fourth flow rate ratio to etch the film stack.

In one exemplary embodiment, (b4) and (b5) are alternately repeated.

In one exemplary embodiment, (b) further includes: (b6) forming a plasma from a processing gas containing HF gas, at least one of $C_xF_y$ gas and phosphorus-containing gas, and $C_uH_vF_w$ gas at a sixth flow rate ratio different from the fourth flow rate ratio and the fifth flow rate ratio to etch the film stack.

Another exemplary embodiment is a plasma processing method performed in a plasma processing apparatus having a chamber, the method comprising: (a) providing a substrate having a film stack including a silicon oxide film and a silicon nitride film to a substrate support in the chamber; (b) forming a plasma in the chamber; and (c) etching the film stack with HF species, $C_xF_y$ species (where x and y are integers equal to or greater than 1), and phosphorus active species contained in the plasma, wherein, in (b), the substrate support is controlled to a temperature of 0° C. or more and 70° C. or less, and a bias RF signal of 10 kW or more or a bias DC signal of 4 kV or more is supplied to the substrate support.

Another exemplary embodiment is a plasma processing system comprising a chamber, a substrate support disposed in the chamber, a power supply, and a controller, wherein the controller is configured to cause: (a) disposing a substrate having a film stack including a silicon oxide film and a silicon nitride film to a substrate support in the chamber; and (b) forming a plasma from a processing gas containing HF gas and at least one of $C_xF_y$ gas (where x and y are integers equal to or greater than 1) and phosphorus-containing gas to etch the film stack, and wherein, in (b), the substrate support is controlled to a temperature of 0° C. or more and 70° C. or less, and a bias RF signal of 10 kW or more or a bias DC signal of 4 kV or more is supplied to the substrate support from the power supply.

The following is a detailed description of embodiments of the present disclosure with reference to the drawings. In the drawings, identical or similar elements are denoted by the same reference numbers and redundant descriptions of these elements has been omitted. In the following description, positional relationships such as up, down, left and right are based on the positional relationships shown in the drawings except where otherwise specified. The dimensional ratios in the drawings do not indicate actual ratios, and the actual ratios are not limited to the ratios shown in the drawings.

Example of Plasma Processing System Configuration

An example of a configuration for the plasma processing system will now be described. FIG. 1 is a figure used to describe an example of a configuration for a capacitively coupled plasma processing apparatus.

The plasma processing system includes a capacitively coupled plasma processing apparatus 1 and a controller 2. The capacitively coupled plasma processing apparatus 1 includes a plasma processing chamber 10, a gas supply 20, a power supply 30, and an exhaust system 40. The plasma processing apparatus 1 also includes a substrate support 11 and a gas introducer. The gas introducer is configured to introduce at least one processing gas to the plasma processing chamber 10. The gas introducer includes a shower head 13. The substrate support 11 is arranged inside the plasma processing chamber 10. The shower head 13 is arranged above the substrate support 11. In an exemplary embodiment, the shower head 13 constitutes at least a portion of the ceiling of the plasma processing chamber 10. The plasma processing chamber 10 has a plasma processing space 10s defined by the shower head 13, the side walls 10a of the plasma processing chamber 10, and the substrate support 11. The plasma processing chamber 10 has at least one gas supply port for supplying at least one processing gas to the plasma processing space 10s, and at least one gas exhaust port for exhausting gas from the plasma processing space. The plasma processing chamber 10 is grounded. The shower head 13 and the substrate support 11 are electrically isolated from the plasma processing chamber 10.

The substrate support 11 includes a main body 111 and a ring assembly 112. The main body 111 has a central region 111a for supporting a substrate W and an annular region 111b for supporting the ring assembly 112. A wafer is an example of a substrate W. The annular region 111b of the main body 111 surrounds the central region 111a of the main body 111 in a plan view. The substrate W is arranged in the central region 111a of the main body 111, and the ring assembly 112 is arranged in the annular region 111b of the main body 111 so as to surround the substrate W in the central region 111a of the main body 111. Therefore, the central region 111a is also known as the substrate support surface for supporting the substrate W, and the annular region 111b is known as the ring support surface for supporting the ring assembly 112.

In one embodiment, the main body 111 includes a base 1110 and an electrostatic chuck 1111. The base 1110 includes a conductive member. The conductive member of the base 1110 can function as a lower electrode. The electrostatic chuck 1111 is arranged on the base 1110. The electrostatic chuck 1111 includes a ceramic member 1111a and an electrostatic electrode 1111b disposed within the ceramic member 1111a. The ceramic member 1111a has a central region 111a. In one embodiment, the ceramic member 1111a also has an annular region 111b. Note that another member surrounding the electrostatic chuck 1111, such as an annular electrostatic chuck or an annular insulating member, may have the annular region 111b. In this case, the ring assembly 112 may be disposed on the annular electrostatic chuck or the annular insulating member, or may be disposed on both the electrostatic chuck 1111 and the annular insulating member. An RF or DC electrode may also be placed within the ceramic member 1111a, in which case the RF or DC electrode functions as the lower electrode. An RF or DC electrode is also referred to as a bias electrode if bias RF signals or DC signals described below are connected to the RF or DC electrode. Note that both the conductive member of the base 1110 and the RF or DC electrode may function as two lower electrodes.

The ring assembly 112 includes one or more annular members. In one embodiment, the one or more annular members include one or more edge rings and at least one cover ring. The edge ring or rings is made of a conductive material or an insulating material, and the cover ring is made of an insulating material.

Also, the substrate support 11 may include a temperature control module configured to keep at least one of the electrostatic chuck 1111, the ring assembly 112, and the substrate at a target temperature. The temperature control module may include a heater, a heat transfer medium, a channel 1110a, or combinations of these. A heat transfer fluid such as brine or a gas flows through the flow path 1110a. In one embodiment, channels 1110a are formed in the base 1110 and one or more heaters are disposed in the ceramic member 1111a of electrostatic chuck 1111. The substrate support 11 may also include a heat transfer gas supply configured to supply a heat transfer gas between the back surface of the substrate W and the central region 111a.

The shower head 13 is configured to introduce at least one processing gas from the gas supply 20 to the plasma processing space 10s. The shower head 13 has at least one gas supply port 13a, at least one gas diffusion chamber 13b, and multiple gas introduction ports 13c. The processing gas supplied to the gas supply port 13a passes through the gas diffusion chamber 13b and is introduced to the plasma processing space 10s via the gas introduction ports 13c. The shower head 13 also includes an upper electrode. In addition to the showerhead 13, the gas introducer may include one or more side gas injectors (SGI) attached to one or more openings formed in a side wall 10a.

The gas supply 20 may include at least one gas source 21 and at least one flow controller 22. In one embodiment, the gas supply 20 is configured to supply at least one processing gas from its respective gas source 21 via its respective flow controller 22 to the shower head 13. Each flow controller 22 may include, for example, a mass flow controller or a pressure-controlled flow controller. The gas supply 20 may also include one or more flow modulating devices that modulate or pulse the flow rate of at least one processing gas.

The power supply 30 includes an RF power supply 31 serving as the first power supply coupled to the plasma processing chamber 10 via at least one impedance matching circuit. The RF power supply 31 is configured to supply at least one RF signal (RF power), such as a source RF signal and a bias RF signal, to at least one lower electrode and/or to at least one upper electrode. In this way, a plasma is formed from at least one processing gas supplied to the plasma processing space 10s. Thus, the RF power supply 31 may function as at least part of a plasma generator configured to form a plasma from one or more processing gases in the plasma processing chamber 10. Also, by supplying a bias RF signal to at least one lower electrode, a bias potential is generated in the substrate W, and ion components in the formed plasma can be attracted to the substrate W.

In one embodiment, the RF power supply 31 includes a first RF generator 31a and a second RF generator 31b. The first RF generator 31a is coupled to at least one lower electrode and/or to at least one upper electrode via at least one impedance matching circuit and configured to generate a source RF signal (source RF power) for plasma generation. In one embodiment, the source RF signal has a frequency in the range from 10 MHz to 150 MHz. In one embodiment, the first RF generator 31a may be configured to generate multiple source RF signals with different frequencies. One or more source RF signals generated are provided to at least one lower electrode and/or to at least one upper electrode.

A second RF generator 31b is coupled to the at least one lower electrode via at least one impedance matching circuit and configured to generate a bias RF signal (bias RF power). The frequency of the bias RF signal may be the same as or different from the frequency of the source RF signal. In one embodiment, the bias RF signal has a frequency lower than that of the source RF signal. In one embodiment, the bias RF signal has a frequency in the range from 100 kHz to 60 MHz. In one embodiment, the second RF generator 31b may be configured to generate multiple bias RF signals with different frequencies. One or more bias RF signals that have been generated are supplied to at least one lower electrode. Also, in various embodiments, at least one of the source RF signal and the bias RF signal may be pulsed.

The power supply 30 may also include a DC power supply 32 coupled to the plasma processing chamber 10. The DC power supply 32 includes a first DC generator 32a and a second DC generator 32b. In one embodiment, the first DC generator 32a is connected to at least one lower electrode and configured to generate a first DC signal. A generated first bias DC signal is supplied to at least one lower electrode. In one embodiment, the second DC generator 32b is connected to at least one upper electrode and configured to generate a second DC signal. The generated second DC signal is supplied to at least one upper electrode.

In various embodiments, at least one of the first and second DC signals may be pulsed. In this case, a sequence of DC-based voltage pulses is supplied to at least one lower electrode and/or at least one upper electrode. The voltage pulses may have rectangular, trapezoidal or triangular pulse waveforms, or some combination of these pulse waveforms. In one embodiment, a waveform generator for generating a sequence of voltage pulses from a DC signal is connected between the first DC generator 32a and at least one lower electrode. Thus, the first DC generator 32a and the waveform generator constitute a voltage pulse generator. When a second DC generator 32b and a waveform generator constitute a voltage pulse generator, the voltage pulse generator is connected to at least one upper electrode. The voltage pulse may have a positive polarity or a negative polarity. Also, the sequence of voltage pulses may include one or more positive voltage pulses and one or more negative voltage pulses in a single cycle. Note that first and second DC generators 32a, 32b may be provided in addition to the RF power supply 31, or a first DC generator 32a may be provided instead of a second RF generator 31b.

The exhaust system 40 can be connected, for example, to a gas outlet 10e provided at the bottom of the plasma processing chamber 10. The exhaust system 40 may include a pressure regulating valve and a vacuum pump. The pressure control valve regulates the pressure inside the plasma processing space 10s. The vacuum pump may include a turbo molecular pump, a dry pump, or a combination of these.

The controller 2 processes computer-executable instructions that get the plasma processing apparatus 1 to perform the steps described in the present disclosure. The controller 2 may be configured to get each element in the plasma processing apparatus 1 to perform the steps described in the present specification. In an exemplary embodiment, some or all of the controller 2 may be provided as part of the plasma processing apparatus 1. The controller 2 may include, for example, a computer 2a. The computer 2a may include, for example, a central processing unit (CPU) 2a1, a storage 2a2, and a communication interface 2a3. The central processing unit 2a1 may be configured to perform control operations by retrieving a program from the storage 2a2 and executing the retrieved program. This program may be stored in the storage 2a2 in advance or may be acquired via another medium when necessary. The acquired program is stored in the storage 2a2, retrieved from the storage 2a2 and executed by the central processing unit 2a1. The medium may be any storage medium readable by the computer 2a or may be a communication line connected to the communication interface 2a3. The storage 2a2 may include random access memory (RAM), read-only memory (ROM), a hard disk drive (HDD), a solid state drive (SSD), or a combination of these. The communication interface 2a3 may communicate with other configurations in the plasma processing apparatus 1 via a communication line such as a local area network (LAN).

Example of the Plasma Processing Method

Figure 2:
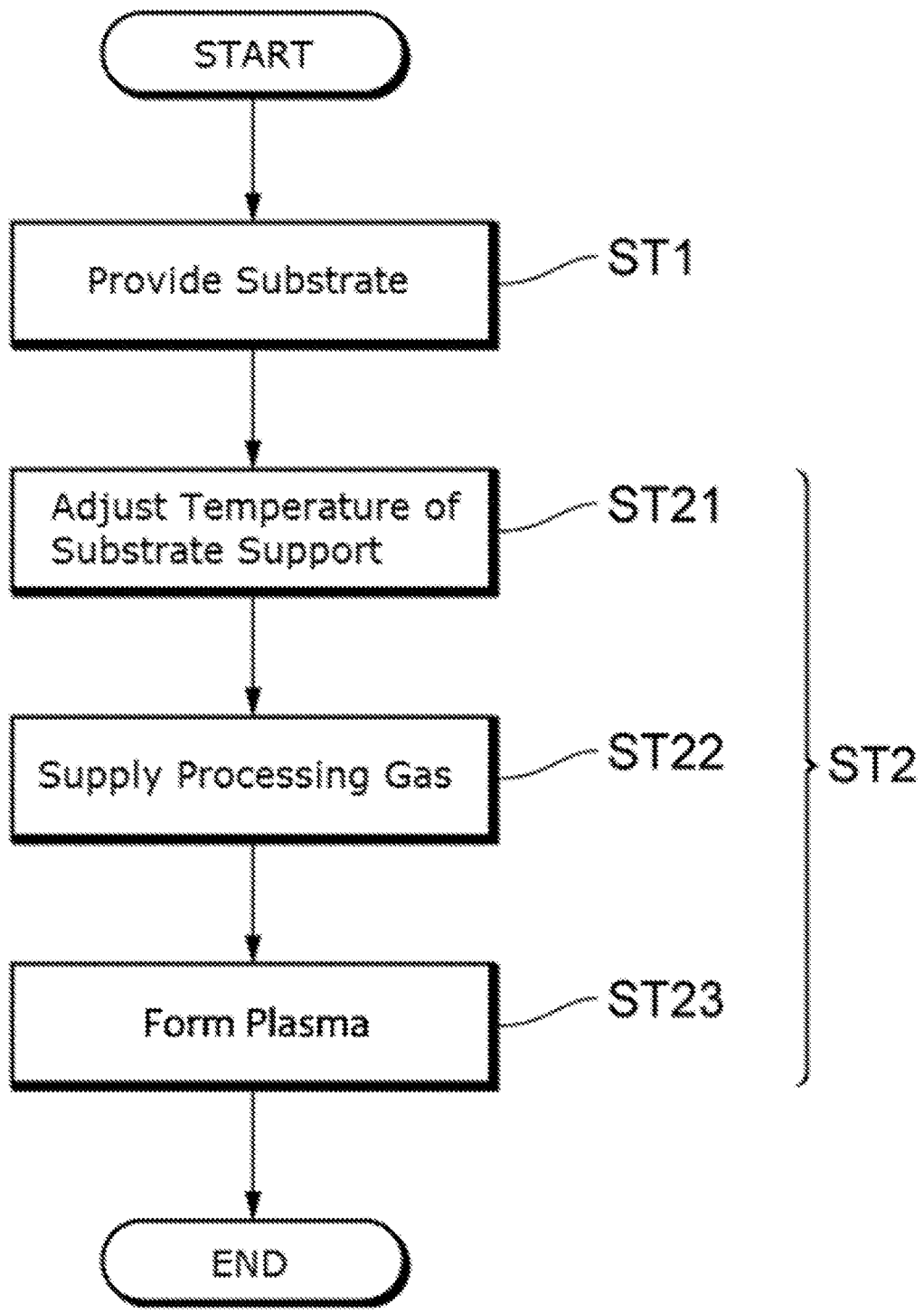
FIG. 2 is a flowchart showing an example of the processing method.

FIG. 2 is a flow chart showing a plasma processing method in an exemplary embodiment ("the processing method" below). As shown in FIG. 2, the processing method includes a step ST1 of providing a substrate and a step ST2 of etching a film stack on the substrate. The processing in each step may be performed by the plasma processing system in FIG. 1. An example will now be described in which the controller 2 controls each element of the plasma processing apparatus 1 to perform the processing method on a substrate W.

(Step ST1: Supplying a Substrate)

In step ST1, a substrate W is provided to the plasma processing space 10s of the plasma processing apparatus 1. The substrate W is disposed on the upper surface of the substrate support 11 so as to face the upper electrode, and is held in place on the substrate support 11 by the electrostatic chuck 1111.

Figure 3:
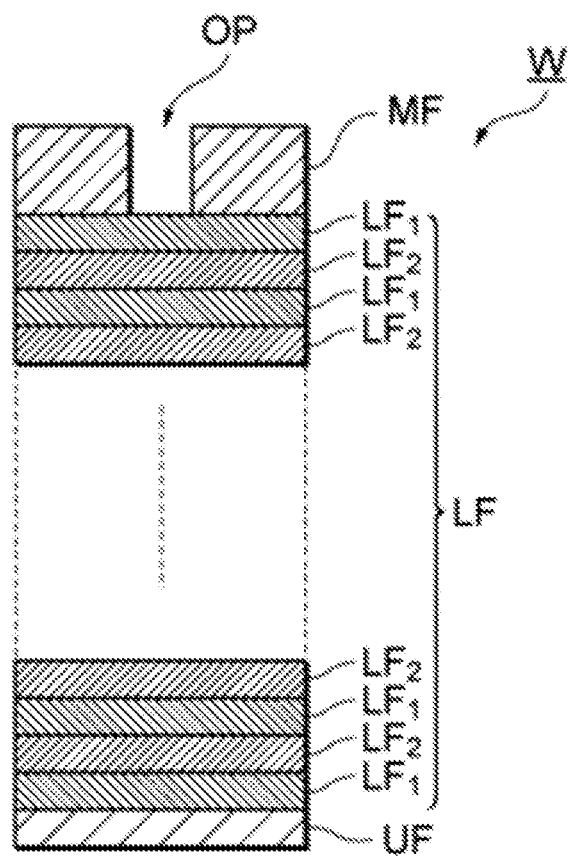
FIG. 3 is a figure schematically illustrating an example of a cross-sectional structure of a substrate W.

FIG. 3 is a figure schematically illustrating an example of the cross-sectional structure of the substrate W provided in step ST1. On the substrate W, a film stack LF and a mask film MF are formed on an underlying film UF in this order. The substrate W may be used, for example, in the manufacture of semiconductor devices, including semiconductor memory devices such as DRAMs and 3D-NAND flash memories.

The underlying film UF may be, for example, a silicon wafer or an organic film, dielectric film, metal film, or semiconductor film formed on a silicon wafer. The underlying film UF may be configured by stacking multiple films.

The film stack LF includes a silicon oxide film ($SiO_x$ film) $LF_1$ and a silicon nitride film $LF_2$. The film stack LF may be multilayer film configured by alternately stacking multiple silicon oxide films $LF_1$ and silicon nitride films $LF_2$. The film stack LF is the film to be etched by the processing method.

The underlying film UF and/or the film stack LF may be formed using, for example, the CVD method or the spin coating method. The underlying film UF and/or the film stack LF may be a flat film or may be uneven film.

The mask film MF is formed on the film stack LF. The mask film MF defines at least one opening OP on the film stack LF. The opening OP is a space above the film stack LF and is surrounded by side walls of the mask film MF. Specifically, in FIG. 3, the upper surface of the film stack LF has a region covered with the mask film MF and a region exposed at the bottom of the opening OP.

The opening OP may have any shape when the substrate W is viewed from above, that is, when the substrate W is viewed downward from above in FIG. 3. The shape of the opening may be, for example, a circle, an ellipse, a rectangle, a line, or a shape combining one or more of these. The mask film MF may have multiple side walls, and the multiple side walls may define multiple openings OP. The openings OP may each have a linear shape and may be arranged at regular intervals to form a line and space pattern. Alternatively, the openings OP may each have a hole shape and form an array pattern.

The mask film MF is, for example, a carbon-containing film. The carbon-containing film may be, for example, an amorphous carbon film, a spin-on carbon film, or a photoresist film. The mask film MF may be a single layer mask consisting of one layer or a multilayer mask consisting of two or more layers. The mask film MF may be formed using CVD method or the spin coating method. The opening OP may be formed by etching the mask film MF. The mask film MF may be formed by lithography.

At least a portion of the process of forming each structure on the substrate W may be performed in the plasma processing chamber 10. In one example, the step of etching the mask film MF to form an opening OP may be performed in the plasma processing chamber 10. In other words, the etching of the opening OP and the etching of the film stack LF to be described later may be continuously performed in the same chamber. Also, the substrate W may be carried into the plasma processing space 10s of the plasma processing apparatus 1 and placed on the upper surface of the substrate support 11 after some or all of each structure on the substrate W has been formed in an apparatus or chamber outside of the plasma processing apparatus 1.

(Step ST2: Etching the Film Stack LF)

In step ST2, the film stack LF is etched. Step ST2 includes a step ST21 of setting the temperature of the substrate support, a step ST22 of supplying a processing gas, and a step ST23 of forming plasma.

In step ST21, a temperature control module adjusts the temperature of the substrate support 11 to a set temperature of 0° C. or higher and 70° C. or lower. The set temperature may be 1° C. or higher and 60° C. or lower, or may be 30° C. or higher and 60° C. or lower. The temperature of the substrate support 11 is kept at the set temperature during processing after step ST2. In one example, adjusting or maintaining the temperature of the substrate support 11 includes adjusting or maintaining the temperature of the heat transfer fluid flowing through a channel 1110a to a set temperature. Adjusting or maintaining the temperature of the substrate support 11 also includes adjusting or maintaining the temperature of the heat transfer fluid flowing through the channel 1110a at a temperature different from the set temperature so that the temperature of the substrate support 11 reaches the set temperature. Note that the heat transfer fluid may start to flow in the channel 1110a before or after the substrate W has been placed on the substrate support, or at the same time. In another example, adjusting or maintaining the temperature of the substrate support 11 includes adjusting or maintaining the temperature of the substrate W at a set temperature. Adjusting or maintaining the temperature of the substrate support 11 includes adjusting or maintaining the temperature of the substrate W at a temperature different from the set temperature so that the temperature of the substrate support 11 reaches the set temperature. "Adjusting" or "maintaining" the temperature also includes inputting, selecting, or storing a temperature in the controller 2.

In step ST22, a processing gas is supplied to the plasma processing space 10s. The processing gas contains HF gas. The processing gas may contain, for example, 50 vol % or more, 60 vol % or more, or 70 vol % or more of HF gas relative to the volume of the processing gas. The HF gas can be gas with a high degree of purity, for example, a purity of 99.999% or more. The processing gas includes $C_xF_y$ gas (where x and y are integers equal to or greater than 1) or phosphorus-containing gas in addition to HF gas. The processing gas may contain both $C_xF_y$ gas and a phosphorus-containing gas. The $C_xF_y$ gas can contribute to an improvement in the etching rate of the silicon oxide film $LF_1$. The phosphorus-containing gas promotes adsorption of the HF gas in the silicon nitride film or silicon oxide film, and can contribute to an improvement in the etching rate of these films.

The flow rate ratio of the $C_xF_y$ gas or the phosphorus-containing gas relative to the HF gas may be set based on the structure of the film stack LF and the pattern of the mask film MF. For example, the flow rate ratio may be set based on the compositional ratio of the silicon oxide film $LF_1$ relative to the film stack LF. In one example, the flow rate ratio of the $C_xF_y$ gas or the phosphorus-containing gas relative to the HF gas may be increased as the compositional ratio of the silicon oxide film $LF_1$ relative to the film stack LF increases. Note that the processing gas may include a gas capable of producing HF species in the chamber instead of or in addition to HF gas. HF species include hydrogen fluoride gas, radicals and/or ions. Gases capable of generating HF species include, for example, one or more gases from the group consisting of $CH_2F_2$ gas, $C_3H_2F_4$ gas, $C_3H_2F_6$ gas, $C_3H_3F_5$ gas, $C_4H_2F_6$ gas, $C_4H_5F_5$ gas, $C_4H_2F_8$ gas, $C_5H_2F_6$ gas, $C_5H_2F_{10}$ gas, and $C_5H_3F_7$ gas. In one example, at least one gas selected from the group consisting of $CH_2F_2$ gas, $C_3H_2F_4$ gas and $C_4H_2F_6$ gas is used as a gas capable of generating HF species.

The $C_xF_y$ gas may be at least one gas selected from the group consisting of $C_3F_6$ gas, $C_4F_6$ gas, $C_4F_8$ gas, and $C_3F_8$ gas.

A phosphorus-containing gas is a gas with phosphorus-containing molecules. The phosphorus-containing molecule may be an oxide such as tetraphosphorus decaoxide ($P_4O_{10}$), tetraphosphorus octaoxide ($P_4O_8$), or tetraphosphorus hexaoxide ($P_4O_6$). Tetraphosphorus decaoxide is sometimes called diphosphorus pentoxide ($P_2O_5$). The phosphorus-containing molecule may be a halide (phosphorus halide) such as phosphorus trifluoride ($PF_3$), phosphorus pentafluoride ($PF_5$), phosphorus trichloride ($PCl_3$), phosphorus pentachloride ($PCl_5$), phosphorus tribromide ($PBr_3$), phosphorus pentabromide ($PBr_5$), or phosphorus iodide ($PI_3$). In other words, the phosphorus-containing molecule may contain fluorine as the halogen element, such as phosphorus fluoride. Alternatively, the phosphorus-containing molecule may contain a halogen element other than fluorine as the halogen element. The phosphorus-containing molecule may be a phosphoryl halide such as phosphoryl fluoride ($POF_3$), phosphoryl chloride ($POCl_3$), and phosphoryl bromide ($POBr_3$). The phosphorus-containing molecule may be phosphine ($PH_3$), calcium phosphide (such as $Ca_3P_2$), phosphoric acid ($H_3PO_4$), sodium phosphate ($Na_3PO_4$), or hexafluorophosphate ($HPF_6$). The phosphorus-containing molecule may be a fluorophosphine ($H_gPF_h$). Here, the sum of g and h is 3 or 5. Examples of fluorophosphines include $HPF_2$ and $H_2PF_3$. The processing gas may contain, at least as a phosphorus-containing molecule, one or more of the phosphorus-containing molecules described above. For example, the processing gas can include at least one of $PF_3$, $PCl_3$, $PF_5$, $PCl_5$, $POCl_3$, $PH_3$, $PBr_3$, or $PBr_5$ as a phosphorus-containing molecule. When each phosphorus-containing molecule in the processing gas is a liquid or solid, each phosphorus-containing molecule can be vaporized by, for example, heating and supplying the gas into the plasma processing space $10s$.

The processing gas may also include an oxygen-containing gas. An oxygen-containing gas can suppress clogging of the mask film MF during etching. For example, at least one gas selected from the group consisting of $O_2$, CO, $CO_2$, $H_2O$ and $H_2O_2$ may be used as the oxygen-containing gas. In one example, the processing gas may include an oxygen-containing gas other than $H_2O$, that is, at least one gas selected from the group consisting of $O_2$, CO, $CO_2$, and $H_2O_2$. The flow rate of the oxygen-containing gas may be adjusted in response to the flow rate of the $C_xF_y$ gas.

The processing gas may also include a $C_uH_vF_w$ gas (where u and v are integers equal to or greater than 1 and w is an integer equal to or greater than 0). The $C_uH_vF_w$ gas may be at least one gas selected from the group consisting of $CH_2F_2$ gas, $CHF_3$ gas, $CH_3F$ gas, $C_4H_2F_6$ gas, $C_3H_2F_4$ gas, and $CH_4$ gas.

The processing gas may also contain a noble gas such as Ar and Kr. The processing gas may further include $NF_3$ gas.

In step ST23, a source RF signal (RF power) is supplied from the first RF generator 31a to the lower electrode and/or the upper electrode. This forms a plasma from the processing gas supplied to the plasma processing space $10s$. Also, a bias RF signal is supplied to the lower electrode from the second RF generator 31b as a bias signal (power). This generates a bias potential in the substrate W. Active species such as ions and radicals in the formed plasma are attracted to the substrate W, and the film stack LF is etched. In other words, the portion corresponding to the opening OP of the mask film MF is etched in the depth direction (direction from top to bottom in FIG. 3) to form a recessed portion in the film stack LF. The timing for starting supply of the source RF signal and the timing for starting supply of the bias signal may be the same or different.

A bias DC signal may be used instead of the bias RF signal as the bias signal (power). In other words, a bias potential may be generated in the substrate W by supplying a negative bias DC signal from the DC generator 32a to the lower electrode. The source RF signal and the bias signal may both be continuous waves, or one may be continuous and the other pulsed.

When a bias RF signal is used as the bias signal, the effective power value of the bias RF signal is 10 kW or more. The effective value of the power of the bias RF signal may be 30 kW or less. When a negative bias DC signal is used as the bias signal, the absolute value of the voltage of the bias DC signal (or the effective value of the absolute value of the voltage in the case of a pulse wave) is 4 kV or more. The absolute value of the voltage of the bias DC signal (or the effective value of the absolute value of the voltage in the case of a pulse wave) may be 15 kV or less.

Experiments conducted to evaluate the processing method are described below. The present disclosure is not limited in any way by the following experiments.

Experiment 1

In Experiment 1, silicon nitride film, silicon oxide film, and carbon-containing film were each etched by forming plasma in the plasma processing apparatus 1 under the following conditions, and the etching rate was measured. An amorphous carbon film was used as the carbon-containing film.

Figure 4:
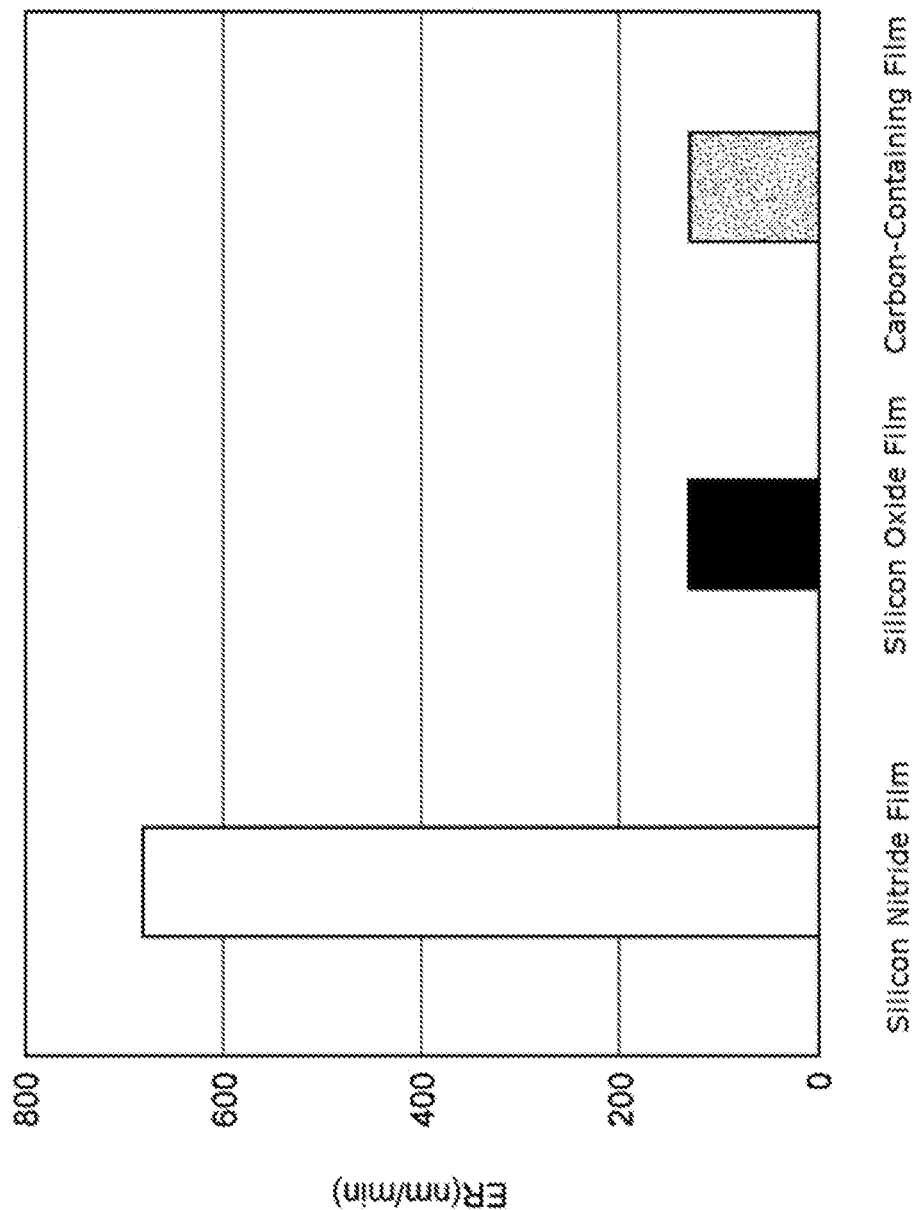
FIG. 4 is a graph showing the measurement results from Experiment 1.

Processing gases: HF gas, Ar gas
Temperature set for the substrate support: 10° C.
Chamber pressure: 25 mT
Source RF signal: 40 MHz/5.5 kW
Bias RF signal: 400 kHz/15 kW FIG. 4 is a graph showing the measurement results from Experiment 1. The vertical axis in FIG. 4 indicates the etching rates (ER) [nm/min] of each of the silicon nitride film, the silicon oxide film, and the carbon-containing film. As shown in FIG. 4, the etching rate of the silicon nitride film was sufficiently higher than the etching rate of the carbon-containing film. This indicates that at the temperature set for the processing method, the HF species in the plasma, which compose the etchant, are adsorbed on the silicon nitride film, and reactive ion etching can proceed. In contrast, the etching rate of the silicon oxide film was low, being about the same as the etching rate of the carbon-containing film. This is probably because the HF species in the plasma, which compose the etchant, were not adsorbed on the silicon oxide film, and the etching was primarily due to sputtering. In other words, at the temperature set for the processing method, the HF species in the plasma, which compose the etchant, are less likely to be adsorbed to the silicon oxide film. It can be seen from Experiment 1 that this processing gas is not sufficient to improve the etching rate of film stack including silicon nitride film and silicon oxide film at the temperature set for the processing method.

Experiment 2

In Experiment 2, the following three processing gas patterns were used in the plasma processing apparatus 1 to form plasma, etch silicon nitride film, silicon oxide film and carbon-containing film, and measure the etching rates. An amorphous carbon film was used as the carbon-containing film. The rest of the conditions were the same as in Experiment 1. Pattern 2 and Pattern 3 are examples of processing gases for the processing method. The flow rate of HF gas in Pattern 3 was twice the flow rate of HF gas in Pattern 2.

Figure 5:
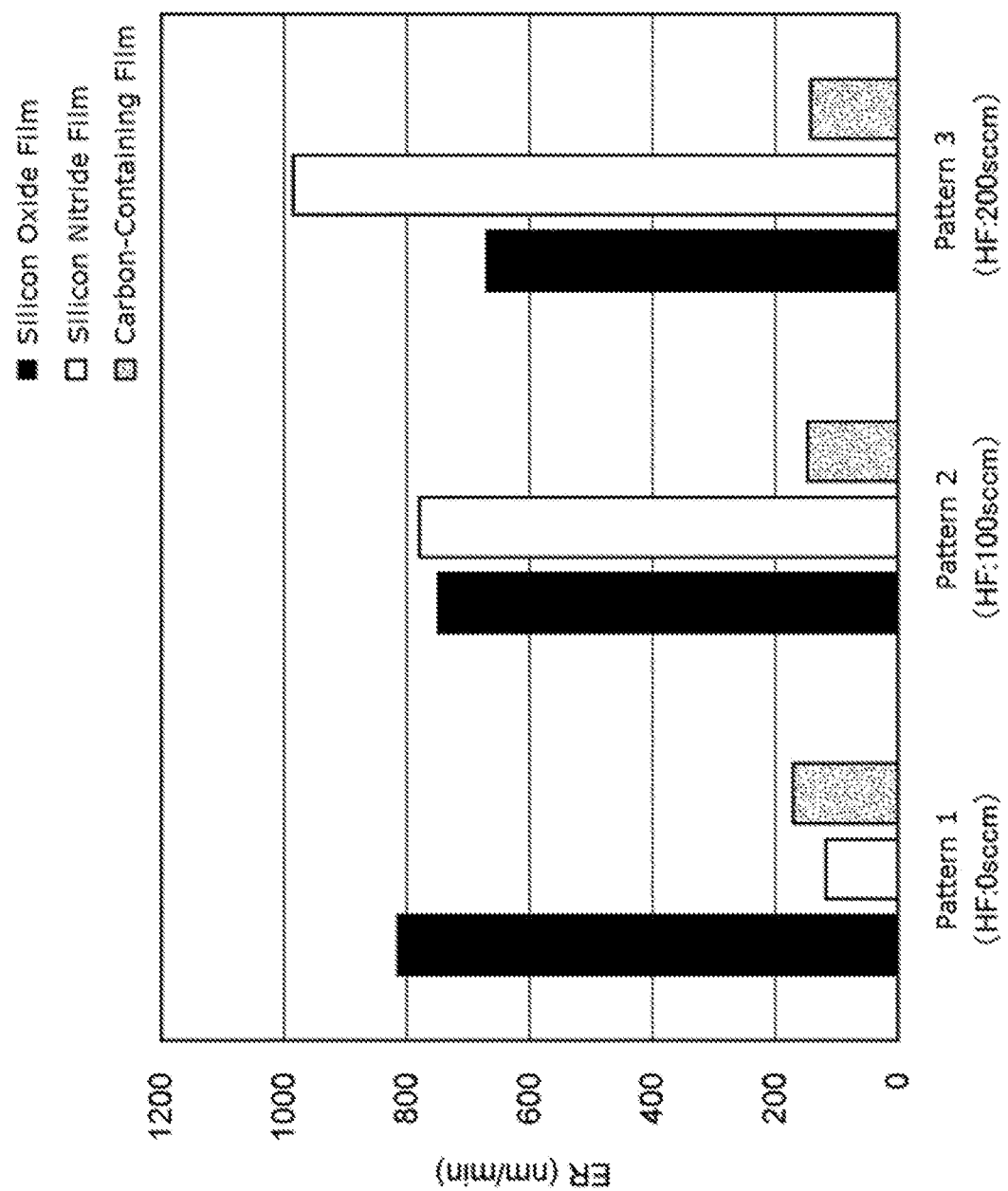
FIG. 5 is a graph showing the measurement results from Experiment 2.

Pattern 1: $C_4F_8$ gas and $O_2$ gas
Pattern 2: $C_4F_8$ gas, HF gas, and $O_2$ gas
Pattern 3: $C_4F_8$ gas, HF gas, and $O_2$ gas FIG. 5 is a graph showing the measurement results from Experiment 2. The vertical axis in FIG. 5 indicates the etching rates (ER) [nm/min] of each of the silicon nitride film, the silicon oxide film, and the carbon-containing film in Pattern 1 to Pattern 3. As shown in FIG. 5, the etching rate of the silicon oxide film was sufficiently high relative to the carbon-containing film in all of Patterns 1 to 3. The etching rate of the silicon nitride film was lower than that of the carbon-containing film when the processing gas did not contain HF gas (Pattern 1), but increased sharply and became sufficiently higher than that of the carbon-containing film when HF gas was included. The etching rate of the carbon-containing film changed very little even when the flow rate of the HF gas was doubled (Patterns 2 and 3), and was low in all of the Patterns 1 to 3. It can be seen from Experiment 2 that when using $C_4F_8$ gas in addition to HF gas as a processing gas at the temperature set for the processing method, selectivity relative to the carbon-containing film can be improved while increasing the etching rate of both the silicon oxide film and the silicon nitride film.

Experiment 3

In Experiment 3, plasma was formed in the plasma processing apparatus 1 using the following three patterns of processing gas, silicon nitride film, silicon oxide film, and carbon-containing film were etched, and the etching rates were measured. An amorphous carbon film was used as the carbon-containing film. The rest of the conditions were the same as in Experiment 1. Pattern 6 is an example of a processing gas for the processing method.

Figure 6:
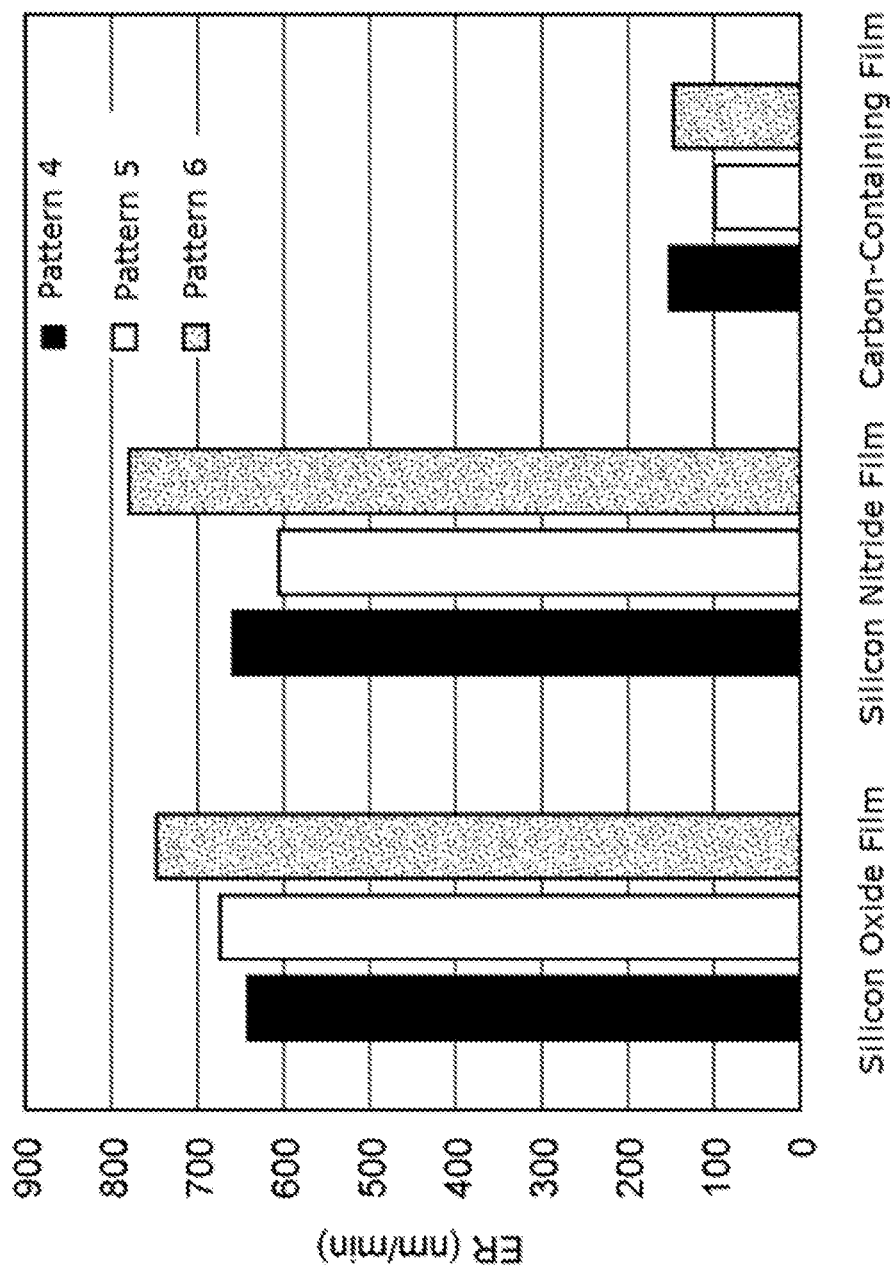
FIG. 6 is a graph showing the measurement results from Experiment 3.

Pattern 4: $C_4F_8$ gas, $CH_2F_2$ gas HF gas, and $O_2$ gas
Pattern 5: $C_4F_8$ gas, $C_3H_2F_4$ gas, and $O_2$ gas
Pattern 6: $C_4F_8$ gas, HF gas, and $O_2$ gas FIG. 6 is a graph showing the measurement results from Experiment 3. The vertical axis in FIG. 6 indicates the etching rates (ER) [nm/min] of each of the silicon nitride film, the silicon oxide film, and the carbon-containing film in Pattern 4 to Pattern 6. As shown in FIG. 6, the etching rate of the silicon oxide film and the silicon nitride film was improved by about 10 to 20% in the case of Pattern 6 containing HF gas as a processing gas compared to Patterns 4 and 5 which contained $CH_2F_2$ gas and $C_3H_2F_4$ gas as a processing gas. The etching rate of the carbon-containing film in Pattern 6 was about the same as that in Patterns 4 and 5. It can be seen from Experiment 3 that when using HF gas as a processing gas at the temperature set for the processing method, high selectivity can be maintained relative to the carbon-containing film while increasing the etching rate compared to the cases using $CH_2F_2$ gas or $C_3H_2F_4$ gas.

Experiment 4

In Experiment 4, plasma was formed using HF gas and a phosphorus-containing gas in plasma processing apparatus 1 to etch silicon nitride film, silicon oxide film, and carbon-containing film, and measure the etching rates. An amorphous carbon film was used as the carbon-containing film. $PF_3$ gas was used as the phosphorus-containing gas, and the etching rate was measured by changing the flow rate ratio (vol %) relative to the total volume of processing gas to 0%, 2%, 7%, 11%, 20%, and 26%. The rest of the conditions were the same as in Experiment 1.

Figure 7:
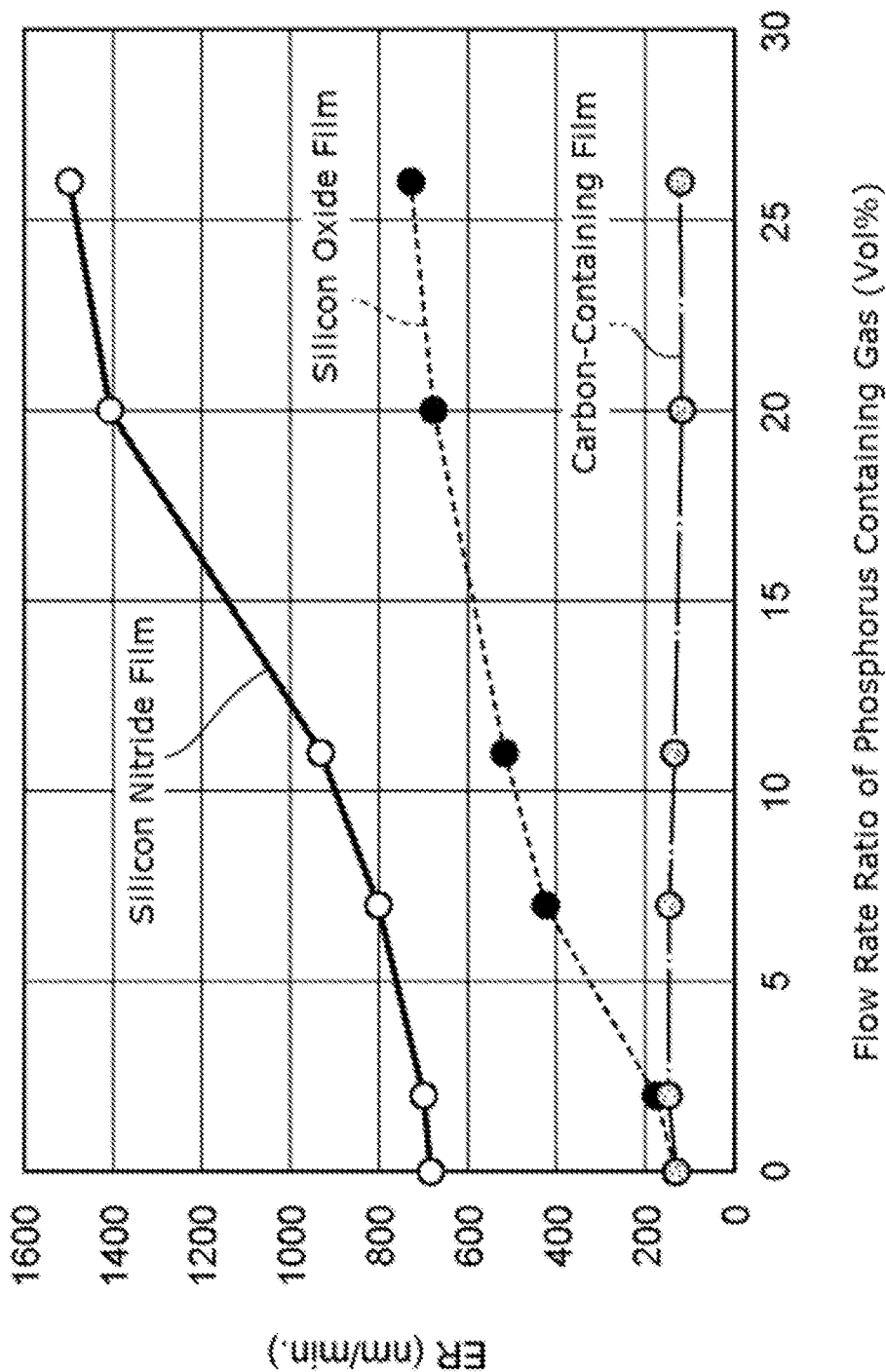
FIG. 7 is a graph showing the measurement results from Experiment 4.

FIG. 7 is a graph showing the measurement results from Experiment 3. The horizontal axis in FIG. 7 indicates the flow rate ratio [vol %] of the phosphorus-containing gas in the processing gas. The vertical axis indicates the etching rate (ER) [nm/min]. As shown in FIG. 7, the etching rates of the silicon oxide film and the silicon nitride film increased significantly as the flow rate ratio of the phosphorus-containing gas in the processing gas increased. The etching rate when the processing gas contained 26% of the phosphorus-containing gas was 5.6 times higher for the silicon oxide film and 2.5 times higher for the silicon nitride film than when the processing gas did not contain a phosphorus-containing gas (0 vol %). This is probably because the phosphorus-containing gas accelerated adsorption of the HF gas, which is an etchant, to the silicon nitride film and the silicon oxide film. Also, as shown in FIG. 7, the etching rate of the carbon-containing film did not increase when the flow rate of the phosphorus-containing gas in the processing gas was increased. It can be seen from Experiment 4 that when using a phosphorus-containing gas in addition to HF gas as a processing gas at the temperature set for the processing method, selectivity relative to the carbon-containing film can be improved while increasing the etching rate of both the silicon oxide film and the silicon nitride film.

EXAMPLES

Examples of the processing method will now be described. The present disclosure is not limited in any way by the following examples.

Examples 1 and 2

The processing method was applied using the plasma processing apparatus 1 to etch the film stack LF on the substrate W shown in FIG. 3. In Examples 1 and 2, HF gas, $PF_3$ gas, and Ar gas were used as processing gases. The flow rate ratio (vol %) of the phosphorus-containing gas to the processing gas was 13% in Example 1 and 20% in Example 2. The other conditions in both Example 1 and Example 2 were as follows.

Temperature set for the substrate support: 10° C.
Chamber pressure: 25 mT
Source RF signal: 40 MHz/5.5 kW
Bias RF signal: 400 kHz/15 kW Reference Example 1

In the reference example, the film stack LF on the substrate W was etched under the same conditions as in the examples, except that the processing gas was changed as follows.

Reference Example 1: HF gas, Ar gas

The etching rates for the film stacks LF in Examples 1 and 2 were 512 [nm/min] and 518 [nm/min], respectively. In contrast, the etching rate in Reference Example 1 was 231 [nm/min]. In other words, the etching rate for the film stack LF in both Example 1 and Example 2 was significantly better than that in Reference Example 1.

In the processing method, $C_xF_y$ gas or phosphorus-containing gas is used as a processing gas in addition to HF gas. As a result, the etching rate of both the silicon oxide film LF1 and the silicon nitride film LF2 constituting the film stack LF can be improved, and the selectivity relative to the mask film MF can be improved.

Also, in the processing method, a bias RF signal of 10 kW or more or a bias DC signal of 4 kV or more is supplied as a bias signal during etching. By using a high-power bias RF signal, volatilization of reaction by-products caused by etching of the film stack LF can be promoted. For example, volatilization of reaction by-products composed primarily of ammonium silicofluoride (AFS) that are generated during etching of silicon nitride film LF2 can be accelerated. This can improve the etching rate of the film stack LF.

Modified Example of the Method

Figure 8:
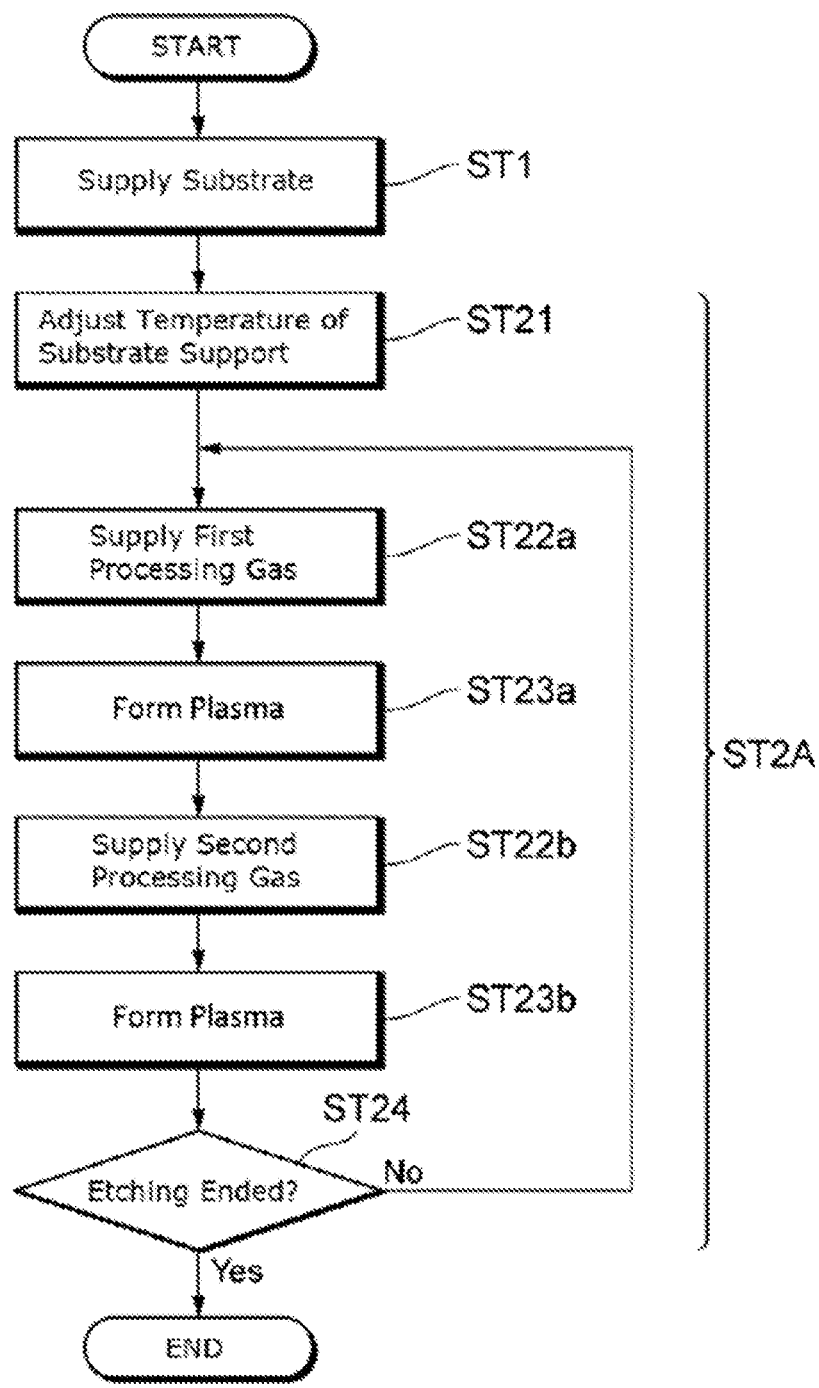
FIG. 8 is a flowchart showing a modified example of the processing method.

FIG. 8 is a flowchart showing a modified example of the processing method. As shown in FIG. 8, the processing method up to step ST21 is the same in the modified example but differs from the processing method described above after step ST21. In the modified example, step ST2A of etching the film stack LF, after step ST21 of adjusting the temperature of the substrate supporting, has step ST22a of supplying a first processing gas, step ST23a of forming a plasma from the first processing gas, step ST22b of supplying a second processing gas, step ST23b of forming a plasma from the second processing gas, and step ST24 of determining whether the etching has been completed. In step ST2A, steps ST22a to ST23b are repeated until it has determined in step ST24 that the etching has been completed.

The first processing gas and the second processing gas contain HF gas and at least one of $C_xF_y$ gas and phosphorus-containing gas. The first processing gas and the second processing gas may also contain other gases such as $C_uH_vF_w$ gas and oxygen-containing gas as in the processing method.

The first processing gas and the second processing gas may differ in terms of the composition and flow rate of the processing gas. In one example, the first processing gas may contain HF gas and at least one of $C_xF_y$ gas and phosphorus-containing gas at a first flow rate ratio. The second processing gas may contain HF gas and at least one of a $C_xF_y$ gas and a phosphorus-containing gas at a second flow rate ratio different from the first flow rate ratio.

In one example, the first processing gas may contain HF gas, at least one of $C_xF_y$ gas and phosphorus-containing gas, and $C_uH_vF_w$ gas at a fourth flow rate ratio. The second processing gas may contain HF gas, at least one of $C_xF_y$ gas and phosphorus-containing gas, and $C_uH_vF_w$ gas at a fifth flow rate ratio different from the fourth flow rate ratio.

The modified example may also include a step of supplying a third processing gas and a step of forming a plasma from the third processing gas between steps ST23b and ST24. The third processing gas may contain HF gas and at least one of a $C_xF_y$ gas and a phosphorus-containing gas at a third flow rate ratio different from the first flow rate ratio and the second flow rate ratio. Also, the third processing gas may contain HF gas, at least one of a $C_xF_y$ gas and a phosphorus-containing gas, and a $C_uH_vF_w$ gas at a sixth flow rate ratio different from the fourth flow rate ratio and the fifth flow rate ratio.

Also, in the modified example, the steps using the first processing gas, the second processing gas, and the third processing gas may be performed once without including step ST24.

In the modified example, the composition of the processing gas can be optimized according to, for example, the compositional ratio of the silicon oxide film $LF_1$ and the silicon nitride film $LF_2$ that constitute the film stack LF and the aspect ratio of the film stack LF. This can improve the overall etching rate for the film stack LF.

Various modifications may be made to the processing method without departing from the scope and spirit of this disclosure. For example, the processing method may be performed using a plasma processing apparatus using a plasma source other than that of a capacitively coupled plasma processing apparatus 1, such as inductively coupled plasma or microwave plasma.

In one exemplary embodiment of the present disclosure, the etching rate can be improved.

The embodiments described above were provided for illustrative purposes only and are not intended to limit the scope of the present disclosure. Various modifications may be applied to each of these embodiments without departing from the scope and spirit of the present disclosure. For example, some elements in one embodiment can be added to another embodiment. Also, some elements in one embodiment can be replaced with corresponding elements from another embodiment.

The invention claimed is:

1. A plasma processing method performed in a plasma processing apparatus having a chamber comprising:
    (a) providing a substrate having a film stack including a silicon oxide film and a silicon nitride film onto a substrate support in the chamber; and
    (b) forming a plasma from a processing gas containing HF gas and at least one of $C_xF_y$ gas (where x and y are integers equal to or greater than 1) and phosphorus-containing gas to etch the film stack,
    wherein, in (b), the substrate support is controlled to a temperature of 0° C. or more and 70° C. or less, and
    wherein, in (b), a bias RF signal of 10 kW or more or a bias DC signal of 4 kV or more is supplied to the substrate support.

2. The plasma processing method according to claim 1, wherein the substrate has a carbon-containing film defining at least one opening on the film stack.

3. The plasma processing method according to claim 2, wherein the carbon-containing film is a photoresist film, a spin-on carbon film, or an amorphous carbon film.

4. The plasma processing method according to claim 1, wherein the $C_xF_y$ gas includes at least one gas selected from the group consisting of $C_3F_6$ gas, $C_4F_8$ gas, $C_4F_6$ gas, and $C_3F_8$ gas.

5. The plasma processing method according to claim 1, wherein the phosphorus-containing gas is a phosphorus halide gas.

6. The plasma processing method according to claim 5, wherein the phosphorus halide gas is phosphorus fluoride.

7. The plasma processing method according to claim 1, wherein the phosphorus-containing gas is at least one gas selected from the group consisting of $PF_3$ gas, $PF_5$ gas, $POF_3$ gas, $HPF_6$ gas, $PCI_3$ gas, $PCl_3$ gas, $POCl_3$ gas, $PBr_3$ gas, PBrs gas, $POBr_3$ gas, $PI_3$ gas, $P_4O_{10}$ gas, $P_4O_8$ gas, $P_4O_6$ gas, $PH_3$ gas, $Ca_3P_2$ gas, $H_3PO_4$ gas, and $Na_3PO_4$ gas.

8. The plasma processing method according to claim 1, wherein the processing gas further includes an oxygen-containing gas.

9. The plasma processing method according to claim 8, wherein the oxygen-containing gas is at least one gas selected from the group consisting of $O_2$, CO, $CO_2$, $H_2O$, and $H_2O_2$.

10. The plasma processing method according to claim 1, wherein the processing gas further includes a $C_uH_vF_w$ gas (where u and v are integers equal to or greater than 1, and w is an integer equal to or greater than 0).

11. The plasma processing method according to claim 10, wherein the $C_uH_vF_w$ gas is at least one gas selected from the group consisting of $CH_2F_2$ gas, $CHF_3$ gas, $CH_3F$ gas, $C_4H_2F_6$ gas, $C_3H_2F_4$ gas, and $CH_4$ gas.

12. The plasma processing method according to claim 10, wherein (b) includes:
- (b4) forming a plasma from a processing gas containing HF gas, at least one of $C_xF_y$ gas and phosphorus-containing gas, and $C_uH_vF_w$ gas at a fourth flow rate ratio to etch the film stack; and
- (b5) forming a plasma from a processing gas containing HF gas, at least one of $C_xF_y$ gas and phosphorus-containing gas, and $C_uH_vF_w$ gas at a fifth flow rate ratio different from the fourth flow rate ratio to etch the film stack.

13. The plasma processing method according to claim 12, wherein (b4) and (b5) are alternately repeated in (b).

14. The plasma processing method according to claim 12, wherein (b) further includes:
- (b6) forming a plasma from a processing gas containing HF gas, at least one of $C_xF_y$ gas and phosphorus-containing gas, and $C_uH_vF_w$ gas at a sixth flow rate ratio different from the fourth flow rate ratio and the fifth flow rate ratio to etch the film stack.

15. The plasma processing method according to claim 1, wherein the bias DC signal is a voltage pulse comprising two alternating periods with different voltage levels.

16. The plasma processing method according to claim 1, wherein (b) includes:
- (b1) forming a plasma from a processing gas containing HF gas and at least one of $C_xF_y$ gas and phosphorus-containing gas at a first flow rate ratio to etch the film stack; and
- (b2) forming a plasma from a processing gas containing at least one of HF gas and $C_xF_y$ gas and phosphorus-containing gas at a second flow rate ratio different from the first flow rate ratio to etch the film stack.

17. The plasma processing method according to claim 16, wherein (b1) and (b2) are alternately repeated in (b).

18. The plasma processing method according to claim 16, wherein (b) further includes:
- (b3) forming a plasma from a processing gas containing HF gas and at least one of $C_xF_y$ gas and phosphorus-containing gas at a third flow rate ratio different from the first flow rate ratio and the second flow rate ratio to etch the film stack.

19. A plasma processing method performed in a plasma processing apparatus having a chamber, the method comprising:
- (a) providing a substrate having a film stack including a silicon oxide film and a silicon nitride film onto a substrate support in the chamber;
- (b) forming a plasma in the chamber; and
- (c) etching the film stack with HF species, $C_xF_y$ species (where x and y are integers equal to or greater than 1), and phosphorus active species contained in the plasma,
- wherein, in (b), the substrate support is controlled to a temperature of 0° C. or more and 70° C. or less, and
- wherein, in (b), a bias RF signal of 10 kW or more or a bias DC signal of 4 kV or more is supplied to the substrate support.

* * * * *